United States Patent
Ko et al.

(10) Patent No.: US 6,756,321 B2
(45) Date of Patent: Jun. 29, 2004

(54) METHOD FOR FORMING A CAPPING LAYER OVER A LOW-K DIELECTRIC WITH IMPROVED ADHESION AND REDUCED DIELECTRIC CONSTANT

(75) Inventors: Chung-Chi Ko, Tainan (TW); Yung-Cheng Lu, Taipei (TW); Lain-Jong Li, HsinChu (TW); Lih-Ping Li, Hsinchu (TW); Yu-Huei Chen, Hsin-Chu (TW); Shu-E Ku, Miaoli (TW)

(73) Assignee: Taiwan Semiconductor Manufacturing Co., Ltd, Hsin Chu (TW)

(*) Notice: Subject to any disclaimer, the term of this patent is extended or adjusted under 35 U.S.C. 154(b) by 0 days.

(21) Appl. No.: 10/264,398

(22) Filed: Oct. 5, 2002

(65) Prior Publication Data
US 2004/0067658 A1 Apr. 8, 2004

(51) Int. Cl.⁷ .................. H01L 21/31; H01L 21/469
(52) U.S. Cl. .................................. 438/778; 438/902
(58) Field of Search ................ 438/778, 785–786, 438/787, 789, 783, 791, 794, 902, 618, 622, 636

(56) References Cited

U.S. PATENT DOCUMENTS

| 6,436,824 B1 | * | 8/2002 | Chooi et al. ................. 438/687 |
| 6,498,112 B1 | * | 12/2002 | Martin et al. ............... 438/763 |
| 6,583,048 B1 | * | 6/2003 | Vincent et al. ............. 438/623 |
| 6,632,478 B2 | * | 10/2003 | Gaillard et al. ........ 427/255.37 |
| 6,656,837 B2 | * | 12/2003 | Xu et al. ..................... 438/676 |
| 2002/0111042 A1 | * | 8/2002 | Yau et al. ..................... 438/789 |
| 2003/0113992 A1 | * | 6/2003 | Yau et al. ..................... 438/623 |
| 2003/0124859 A1 | * | 7/2003 | Cheung et al. ............. 438/692 |
| 2003/0143832 A1 | * | 7/2003 | Shroff et al. ................. 438/618 |

* cited by examiner

Primary Examiner—Richard Elms
Assistant Examiner—Beth E. Owens
(74) Attorney, Agent, or Firm—Tung & Associates

(57) ABSTRACT

A method for forming a capping layer for improved adhesion with an underlying insulating layer in a multiple layer semiconductor device manufacturing process including providing a semiconductor wafer including a process surface comprising a dielectric insulating layer; and, providing a capping layer overlying the dielectric insulating layer according to a chemical vapor deposition CVD) process. The capping layer of the present invention has improved adhesion and a reduced dielectric constant with comparable current leakage compared to capping layers of the prior art.

19 Claims, 1 Drawing Sheet

METHOD FOR FORMING A CAPPING LAYER OVER A LOW-K DIELECTRIC WITH IMPROVED ADHESION AND REDUCED DIELECTRIC CONSTANT

FIELD OF THE INVENTION

This invention generally relates to semiconductor device manufacturing methods and more particularly to methods for improving adhesion of a capping layer with reduced dielectric constant with overlying low-k dielectric insulating materials.

BACKGROUND OF THE INVENTION

In semiconductor fabrication, various layers of insulating material, semiconducting material and conducting material are formed to produce a multilayer semiconductor device. The layers are patterned to create features that taken together, form elements such as transistors, capacitors, and resistors. These elements are then interconnected to achieve a desired electrical function, thereby producing an integrated circuit (IC) device. The formation and patterning of the various device layers are achieved using conventional fabrication techniques, such as oxidation, implantation, deposition, epitaxial growth of silicon, lithography, etching, and planarization.

Since the introduction of semiconductor devices, the size of semiconductor devices has been continuously shrinking, resulting in smaller semiconductor chip size and increased device density. One of the limiting factors in the continuing evolution toward smaller device size and higher density has been signal delay caused by parasitic effects of insulating materials in which metal interconnects are formed to interconnect devices. It has become necessary to reduce capacitance of the insulating layers to allow the insulating layer thicknesses to shrink along with other device features such as metal interconnect line width. As a result, the need for lower dielectric constant materials has resulted in the development of several different types of organic and inorganic low-k materials.

In the fabrication of semiconductor devices multiple layers may be required for providing a multi-layered interconnect structure. During the manufacture of integrated circuits it is common to place material photoresist on top of a semiconductor wafer in desired patterns and to etch away or otherwise remove surrounding material not covered by the resist pattern in order to produce metal interconnect lines or other desired features. During the formation of semiconductor devices it is often required that the conductive layers be interconnected through holes in an insulating layer. Such holes are commonly referred to as contact holes, i.e., when the hole extends through an insulating layer to an active device area, or vias, i.e., when the hole extends through an insulating layer between two conductive layers.

Manufacturing processes such as, for example, damascene processes, have been implemented to form metallization vias and interconnect lines (trench lines) by dispensing entirely with the metal etching process. The damascene process is a well known semiconductor fabrication method for forming multiple layers of metallization vias and interconnect lines. For example, in the dual damascene process, a trench opening and via opening is etched in an insulating layer also known as an inter-metal or inter-level dielectric (IMD/ILD) layer. The insulating layer is typically formed over a substrate including another conductive area over which the vias and trench lines are formed and in communication with. After a series of photolithographic steps defining via openings and trench openings, via and the trench openings are filled with a metal, preferably copper, to form metallization vias and interconnect lines (trench lines), respectively. The excess metal above the trench line level is then removed by well known chemical-mechanical planarization (polishing) (CMP) processes.

As indicated, advances in semiconductor device processing technology demands the increasing use of low-k (low dielectric constant) insulating materials in, for example, IMD (ILD) layers that make up the bulk of a multilayer device. In order to reduce signal delays caused by parasitic effects related to the capacitance of insulating layers, for example, IMD layers, incorporation of low-k materials has become standard practice as semiconductor feature sizes have diminished. Many of the low-k materials are designed with a high degree of porosity to allow the achievement of lower dielectric constants. Several different organic and inorganic low-k materials have been developed and proposed for use in semiconductor devices as insulating material having dielectric constants less than about 3.0 for achieving integration of, for example, 0.13 micron interconnections. In the future, even lower dielectric constant material, for example less than about 2.5, will be required for 0.1 micron process integration. An exemplary low-k inorganic material that is frequently used, for example, is carbon doped silicon dioxide (C-oxide) formed by a CVD process where the dielectric constant may be varied over a range depending on the process conditions. C-oxide, for example, may be formed with dielectric constants over a range of about 2.0 to about 3.0 and density of about 1.3 $g/cm^3$ compared to dielectric constants of about 4.1 and a density of about 2.3 $g/cm^3$ for silicon dioxides (e.g., un-doped TEOS). Other exemplary low-k inorganic materials include porous oxides, xerogels, or SOG (spin-on glass). Exemplary low-k organic materials include polysilsequioxane, parylene, polyimide, benzocyclobutene and amorphous Teflon.

Regardless of whether, the low-k insulating material is organic or inorganic, the presence of porosity, for example, mesoporosity, is generally required to achieve the desired low dielectric constant of between about 2.0 and about 3.0.

As might be expected, the development of porous low-k materials has presented several problems in manufacturing methods that must be overcome. Among the problems presented by porous materials, especially if they are hydrophilic, is the tendency to absorb moisture which may interfere in subsequent dry etching processes. Another problem is the tendency of porous materials, especially those with interconnecting pores, is to absorb chemical species, for example, nitrogen containing species present in CVD processes to form capping or etch stop layers, of for example, silicon nitride (SiN) or silicon oxynitride (SiON), over the insulating layers and such species believed to interfere with subsequent photolithographic processes.

Another important limitation is that porous low-k materials have low strength and are subject to cracking or peeling in subsequent manufacturing processes including, for example, chemical mechanical planarization (CMP). In order to protect the porous low-k insulating material layers, it has been the practice to add a capping layer over the insulating layer such as a metal nitride including for example, silicon nitride (SiN) and silicon oxynitride (SiON). Additionally, silicon carbide (SiC) has been used as a capping layer to protect the insulating layer in subsequent processing steps including CMP. One problem with the prior art capping layer technology is that due to the high porosity present in low-k insulating materials, adhesion between the capping layer and the insulating layer has proven to be poor, resulting in, for example, peeling, when subjected to the stresses of CMP. Another problem has been that the capping layer adds to the overall dielectric constant and therefore capacitance of the multilayer device making it desirable to make the capping layer as thin as possible, with the undesirable corresponding consequence of current leakage between metal interconnect lines.

It would therefore be advantageous to develop a method for forming a capping layer for use over a porous low-k insulating material layer in a multiple layer semiconductor device that has improved adhesion to the low-k insulating material while additionally having a lower dielectric constant compared to conventional capping layer materials, yet achieves at least the same degree of electrical isolation.

It is therefore an object of the invention to present a method for forming a capping layer for use over a porous low-k insulating material layer in a multiple layer semiconductor device that has improved adhesion to the low-k insulating material while additionally having a lower dielectric constant compared to conventional capping layer materials while overcoming other deficiencies and shortcomings of the prior art.

SUMMARY OF THE INVENTION

To achieve the foregoing and other objects, and in accordance with the purposes of the present invention, as embodied and broadly described herein, the present invention provides a method for forming a capping layer for improved adhesion with an underlying insulating layer in a multiple layer semiconductor device manufacturing process.

In a first embodiment, the method includes providing a semiconductor wafer including a process surface comprising a dielectric insulating layer; and, providing a capping layer overlying the dielectric insulating layer according to a chemical vapor deposition CVD) process.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

The method and apparatus according to the present invention is more clearly described by referring to FIGS. 1A through 1F.

Although the present invention is explained by reference to a dual damascene process it will be appreciated that the method according to the present invention for forming a protective capping layer over a porous low-k insulating material is not limited to a damascene process and that the present invention applies to any semiconductor feature manufacturing process where improved adhesion with a low-k insulating material would be advantageous with the additional benefit of a lower dielectric constant relative to capping layer methods according to the prior art.

Further, although in making exemplary reference to a damascene process by referring only to a single layer process it will be appreciated that the single layer process may be repeated in multiple layers for forming a multiple layer semiconductor device.

As used herein, the term low-k refers to a dielectric constant of less than about 3.0. Further, as used herein, the term porous refers to interconnecting or non-interconnecting pores, including mesopores, with a porosity of from about 20 percent to about 80 percent by volume and including pore diameters ranging from about 5 Angstroms to about 50 Angstroms. In addition, the term about as used herein refers to a value within about 10 percent of the stated value.

There are several techniques for manufacturing damascene structures including a dual damascene process such as via first fabrication, self-aligned fabrication, and trench first fabrication. In the following illustrations, emphasis is be placed on trench first fabrication, and is explained with reference to the trench opening portion of the process, however, the benefits of and advantages of the present invention should be understood to extend to all damascene and dual damascene fabrication techniques. In a typical damascene process, for example, a dual damascene manufacturing process known in the art as a trench-first process conventional photolithographic processes using a photoresist layer is first used to expose and pattern an etching mask on the surface of a hard mask layer overlying a low-k insulating (IMD/ILD) layer, for etching trench openings through the low-k insulating layer. Subsequently a similar process is used to define via openings that are formed within the trench openings which in turn define metallization vias that are formed through another a second insulating layer. The via openings and trench openings are subsequently filled with metal, preferably copper, to form vias and trench lines (metal interconnect lines). The surface may then be planarized by conventional techniques such as chemical mechanical planarization (CMP) to remove excess metal and better define the trench lines and prepare the multilayer device for further processing.

Figure 1A:
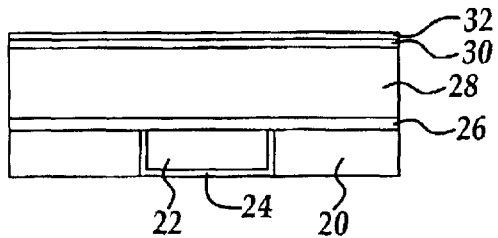
FIGS. 1A–1F are cross sectional side view representations of a portion of a semiconductor device as different stages in a manufacturing process to form a dual damascene structure in a multiple layer semiconductor device.

Referring to FIG. 1A, in a typical dual damascene process, for example, a trench-first process, a substrate 20, for example an insulating material having a conductive area 22 is provided, for example a copper filled trench line. The conductive area 22 may include a barrier layer 24 lining the trench such as tantalum nitride (TaN) to protect the insulating layer from diffusion of copper from the trench line. Next, an etching stop layer 26 is provided over the substrate, for example silicon nitride (SiN), silicon oxynitride (SiON) or silicon carbide (SiC) to act as an etching stop in a subsequent operation where via openings are etched through an overlying insulating layer to form closed communication with the conductive area 22. The etching stop layer is typically deposited by chemical vapor deposition using for example, PECVD, or high density plasma CVD (HDP-CVD).

Following deposition of the etching stop layer 26 an insulating layer is deposited to the desired thickness of the via openings, for example from about 4000 Angstroms to about 5000 Angstroms. It will be appreciated that two insulating layers may be used, one for forming the vias therein and one for forming the trench lines therein. It will be further appreciated that if two insulating layers are used, preferably a low-k insulating material is at least used for the trench line insulating layer as the effects of signal delay capacitance effects are greater for metal interconnect lines (trench lines). However, low-k insulation materials may be used for both the via insulating layer and the trench line layer. In the exemplary application of the present invention as explained, only the trench line insulating layer is shown as low-k insulating layer including an overlying capping layer of the present invention. It will be appreciated however, that the capping layer of the present invention may additionally be included over the via insulating layer if the via insulating layer includes a low-k material.

Following deposition of the etching stop layer, a via insulating layer 28 is deposited with a thickness of about 4000 to about 5000 Angstroms. The via insulating layer may be a low-k insulating material, for example, carbon-doped silicon dioxide (C-oxide) with a dielectric constant of less than about 3.0 or may be a silicon dioxide including, for example, a PECVD un-doped TEOS silicon dioxide, a PECVD fluorinated silica glass (FSG), or an HDP-CVD FSG.

Following deposition of the via insulating layer 28, a second etching stop layer 30, of for example, SiON or SiC is formed over the via insulating layer to act as an etching stop for the subsequent plasma etching process to form a trench line opening in an overlying 10-k insulating layer. Further the etching stop layer 30 acts as a hard etching mask for a via opening patterned over the exposed etching stop layer 30 within the trench line opening as further explained below. Optionally, a dielectric anti-reflective coating (DARC) layer 32 may be formed over the etching stop layer 30 to minimized light reflected in a subsequent photolithographic patterning step for defining via openings.

Figure 1B:
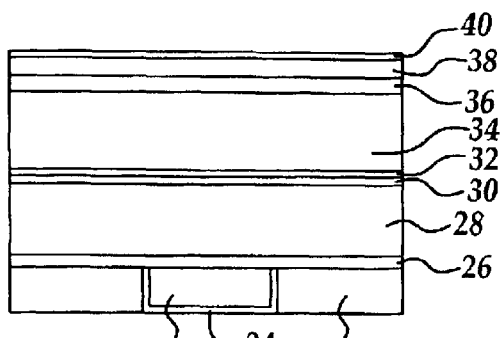

Turning to FIG. 1B, a trench line insulating layer 34 is then formed over the DARC layer 32 with a thickness of from about 4000 to about 6000 Angstroms. The trench line insulating layer formed over the DARC layer 32 layer is preferably a porous low-k (low dielectric constant) insulating material having a dielectric constant of less than 3.0, more preferably, less than about 2.5. Exemplary low-k materials include inorganic porous oxides, xerogels, or SOG (spin-on glass). Exemplary low-k organic materials include polysilsequioxane, parylene, polyimide, benzocyclobutene and amorphous Teflon. More preferably, the inorganic porous low-k material is carbon doped silicon dioxide (C-oxide) formed by a known CVD process forming, for example, silicon dioxide including, for example Si—$CH_4$, or other hydrocarbon ligands, whereby the dielectric constant may be altered by altering the amount and size of the hydrocarbon ligand included in the insulating layer. Preferably, the dielectric constant of the low-k material is less than about 2.5.

Following formation of the low-k trench line insulating layer 34, according to the present invention, a protective capping layer 36 of from about 300 Angstroms to about 800 Angstroms in thickness is formed over the low-k trench line insulating layer 34 according to a high pressure process. Preferably, the capping layer 36 according to the present invention is formed using one or more alkyl-silane precursors, for example mono-methyl silane, dimethyl-silane, tetra-methyl silane (TMS), or mixtures thereof. The alkyl-silane precursor is supplied in the presence of source gases including a nitrogen containing gas, for example, ammonia ($NH_3$), and an inert gas, for example, helium (He). The source gases and the alkyls-silane precursor are, for example individually fed to a CVD deposition chamber which may include forming a plasma in a PECVD process to form a protective capping layer over the dielectric insulating layer. The capping layer includes forms a composition frequently referred to as silicon carbonitride (e.g., SiCN). The CVD process is preferably carried out at high pressure of about 3 Torr to about 7 Torr, more preferably, about 5 Torr. According to the present invention the protective capping layer is formed with a density of from about 1.3 gms/$cm^3$ to about 1.6 gms/$cm^3$. Further, according to the processing conditions of the present invention the capping layer is preferably carbon rich having a weight percent of carbon from about 5 weight percent to about 30 weight percent with respect to the total weight of the capping layer. It will be appreciated that the density of the capping layer (film) depends on the amount of carbon present, a higher weight percent of carbon resulting in a lower density. The protective capping layer 36 is formed at a thickness from about 200 Angstroms to about 1000 Angstroms, more preferably from about 400 Angstroms to about 600 Angstroms.

According to an exemplary embodiment of the present invention, preferred processing conditions in the CVD process to form the capping layer include gas flow rates of the alkyl-silane precursor of about 50 SCCM to about 160 SCCM, He at about 100 SCCM to about 300 SCCM, and $NH_3$ at about 60 to about 400 SCCM. Further, preferably, an overall CVD deposition pressure is maintained at between about 3 Torr to about 7 Torr. In addition, the temperature of the substrate is maintained at about 300° C. to about 400° C. during the deposition.

Following deposition of the capping layer 36 according to the present invention, a hard mask layer 38 of for example, silicon oxynitride (SiON) is formed over the capping layer to provide a low reflectance hard mask. Another layer 40 may be optionally formed over the hard mask layer 38 to form a second dielectric anti-reflective coating (DARC), such as SiON or TiN, to minimize reflectance in a subsequent photolithographic patterning process to define trench openings.

Figure 1C:
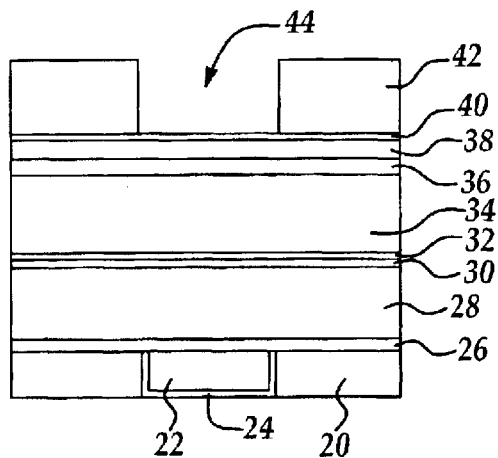
Figure 1D:
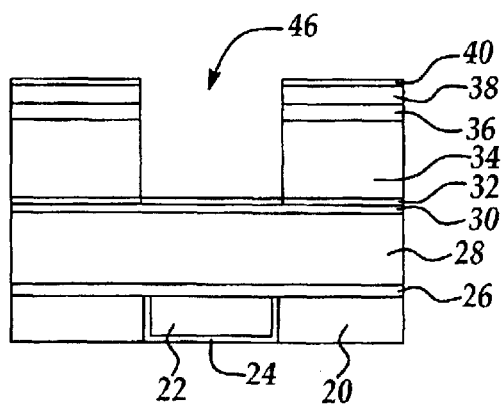
Figure 1E:
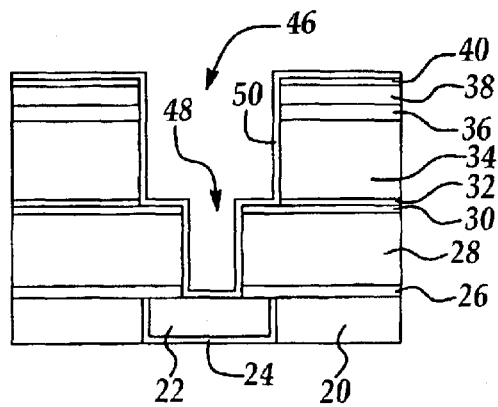

Turning to FIG. 1C, a photoresist layer 42 is formed over the DARC layer 40 and an etching pattern defining a trench line opening 44 formed following conventional photolithographic patterning of the photoresist layer 42. A conventional multiple-step reactive ion etch (RIE) process is then used to first etch through the hard mask SiON layer 38 including the second DARC layer 40, and then to etch through the capping layer 36 and low-k insulating layer 34 to form a trench opening 46 as shown in FIG. 1D. The photoresist layer 42 is then typically removed by an $O_2$ plasma ashing process. A similar process is then used to pattern one or more via openings within the trench opening 46 for plasma etching through the etching stop layer 30 and DARC layer 32, via insulating layer 28, and etching stop layer 26 to form via opening 48 in closed communication with the underlying conductive area 22 as shown in FIG. 1E. Formation of the via opening 48 is typically followed by conformally depositing a barrier layer 50 of, for example, Tantalum nitride (TaN) or SiON within the via and trench openings to protect the low-k insulating layer from diffusion of, for example, copper subsequently used to fill the via opening 48 and trench opening 46.

Figure 1F:
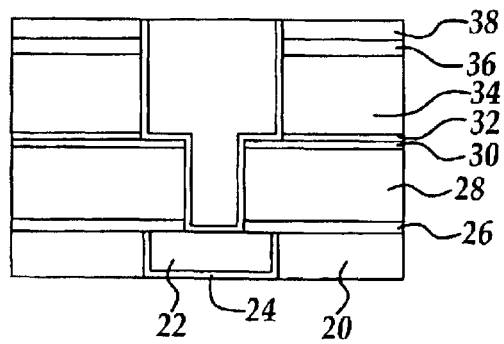

Typically, a CMP process is then used to remove the conformally deposited barrier layer overlying the hard mask anti-reflective SiON layer including a portion of the SiON layer to reduce the overall capacitance of the multiple layer device. In subsequent processing steps, the dual damascene structure is completed by filling the via opening 48 and trench opening 46 with a metal, for example, copper using a vapor deposition process or an electrodeposition process onto a copper seed layer (not shown) blanket deposited to form a continuous layer to including lining the via opening 46 and trench opening 48. Excess metal, for example, copper is then removed by another planarization process such as CMP to remove any excess metal to complete the dual damascene structure as shown in FIG. 1F.

According to the capping layer of the present invention, the dielectric constant is less than about 4.0 compared to the capping layers of the prior art such as SiC, having a dielectric constant of about 4.7 and SiN or SiON having dielectric constants greater than about 5.0. Further, it has been found according to the present invention that the incidence of peeling of the low-k dielectric layer following CMP is lowered, thus providing improved adhesion between the capping layer and the low-k insulating layer according to the present invention. Moreover, the capping layer according to the present invention has demonstrated current leakage results that are at least as good as current leakage results using capping layers according to the prior art.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for forming a capping layer for improved adhesion with an underlying insulating layer in a multiple layer semiconductor device manufacturing process comprising the steps of:

provid ing a semiconductor wafer including a process surface comprising a dielectric insulating layer, said dielectric insulating layer comprises at least one member selected from the group consisting of polysilsequioxane, parylene, polyimide, benzocyclobutene, and amorphous Teflon; and, forming a capping layer overlying the dielectric insulating layer by a chemical vapor deposition (CVD) process conducted between an alkyl-silane precursor and at least one nitrogen-containing gas.

2. The method of claim 1, wherein the at least one nitrogen containing gas comprises ammonia ($NH_3$).

3. The method of claim 1, wherein said at least one alkyl-silane precursor comprises at least one member selected from the group consisting of methyl silane, dimethyl silane, and trimethyl silane.

4. The method of claim 1, wherein said dielectric insulating layer has a dielectric constant of less than about 3.0.

5. The method of claim 1, wherein said dielectric insulating layer comprises at least one of a carbon-doped silicon dioxide, a xerogel, and a spin-on glass.

6. The method of claim 1, wherein said dielectric insulating layer has a porosity between about 20 volume percent to about 80 volume percent with respect to the total volume of the dielectric insulating layer.

7. The method of claim 1, wherein said CVD process is carried out at a pressure of from about 3 Torr to about 7 Torr.

8. The method of claim 1, wherein said CVD process is carried out at a temperature of from about 300 degrees Centigrade to about 400 degrees Centigrade.

9. The method of claim 1, wherein said capping layer is formed to a density of less than about 1.6 gms/$cm^3$.

10. The method of claim 1, wherein said capping layer has a dielectric constant of less than about 4.0.

11. The method of claim 1, wherein said capping layer has a thickness of from about 300 Angstroms to about 800 Angstroms.

12. The method of claim 1, wherein said capping layer has a carbon content of from about 5 weight percent to about 30 weight percent.

13. The method of claim 1 further comprising forming at least one layer of silicon oxynitride over said capping layer.

14. A method for forming a capping layer for improved adhesion with an underlying insulating layer in a multiple layer semiconductor device manufacturing process comprising the steps of:

providing a semiconductor wafer including a process surface comprising a dielectric insulating layer, said dielectric insulating layer comprises at least one member selected from the group consisting of polysilsequioxane, parylene, polyimide, benzocyclobutene, and amorphous Teflon;

forming a capping layer overlying the dielectric insulating layer according to a chemical vapor deposition (CVD) process between at least one alkyl-silane precursor and nitrogen-containing gas; and, forming an anti-reflective metal nitride layer over the capping layer.

15. The method of claim 14, wherein said dielectric insulating layer has a dielectric constant of less than about 2.5.

16. The method of claim 14, wherein said CVD process is carried out at a pressure of from about 3 Torr to about 7 Torr.

17. The method of claim 14, wherein said at least one alkyl-silane precursor is selected from the group consisting of methyl silane, dimethyl silane, and trimethyl silane.

18. The method of claim 14, wherein said capping layer has a thickness of from about 300 Angstroms to about 800 Angstroms.

19. The method of claim 14, wherein said capping layer has a carbon content of from about 5 percent by weight to about 30 percent by weight.

* * * * *